(12) United States Patent
Vaartstra

(10) Patent No.: US 7,488,386 B2
(45) Date of Patent: Feb. 10, 2009

(54) ATOMIC LAYER DEPOSITION METHODS AND CHEMICAL VAPOR DEPOSITION METHODS

(75) Inventor: Brian A. Vaartstra, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/452,817

(22) Filed: Jun. 13, 2006

(65) Prior Publication Data

US 2006/0231017 A1 Oct. 19, 2006

Related U.S. Application Data

(63) Continuation of application No. 10/133,947, filed on Apr. 25, 2002, now Pat. No. 7,374,617.

(51) Int. Cl.
*C30B 23/00* (2006.01)
*C30B 28/14* (2006.01)

(52) U.S. Cl. .............................. 117/84; 117/88; 117/89; 117/92; 117/93; 117/102; 117/105; 117/939

(58) Field of Classification Search .................. 117/84, 117/88, 92, 105, 89, 93, 102, 939
See application file for complete search history.

(56) References Cited

U.S. PATENT DOCUMENTS

| | | | |
|---|---|---|---|
| 5,554,501 | A | 9/1996 | Coassin et al. |
| 6,203,613 | B1 | 3/2001 | Gates et al. |
| 6,511,539 | B1 | 1/2003 | Raaijmakers |
| 6,528,430 | B2 | 3/2003 | Kwan et al. |
| 6,576,053 | B1 | 6/2003 | Kim et al. |
| 6,730,163 | B2 | 5/2004 | Vaarstra |
| 6,730,164 | B2 | 5/2004 | Vaarstra et al. |
| 6,753,618 | B2 | 6/2004 | Basceri et al. |
| 6,780,704 | B1 | 8/2004 | Raaijmakers |
| 6,787,185 | B2 * | 9/2004 | Derderian et al. ...... 427/255.25 |
| 6,838,125 | B2 * | 1/2005 | Chung et al. ................. 427/562 |
| 6,863,725 | B2 | 3/2005 | Vaarstra et al. |

(Continued)

FOREIGN PATENT DOCUMENTS

WO WO 01/27346 A1 4/2001

OTHER PUBLICATIONS

Park et al., "Plasma-Enhanced Atomic Layer Deposition of Tantalum Nitrides Using Hydrogen Radicals as a Rent", Electrochemical and Solid-State Letters, 4 (4) C17-C19, Feb. 2001.

(Continued)

*Primary Examiner*—Robert M Kunemund
*Assistant Examiner*—G. Nagesh Rao
(74) *Attorney, Agent, or Firm*—Wells St. John P.S.

(57) ABSTRACT

The invention includes atomic layer deposition methods and chemical vapor deposition methods. In a particular aspect of the invention, a source of microwave radiation is provided proximate a reaction chamber. At least a fragment of a precursor material is chemisorbed on a substrate within the reaction chamber while not exposing the precursor material to microwave radiation from the source. Excess precursor material is removed from the chamber, and the chemisorbed material is subsequently exposed to microwave radiation from the source within the reaction chamber.

14 Claims, 3 Drawing Sheets

U.S. PATENT DOCUMENTS

| | | | |
|---|---|---|---|
| 7,067,420 | B2 | 6/2006 | Choi et al. |
| 7,098,131 | B2 | 8/2006 | Kang et al. |
| 7,393,562 | B2 * | 7/2008 | Derderian et al. ...... 427/255.25 |
| 2001/0024387 | A1 | 9/2001 | Raaijmakers et al. |
| 2002/0164420 | A1 * | 11/2002 | Derderian et al. ........ 427/248.1 |
| 2002/0182320 | A1 | 12/2002 | Leskela et al. |
| 2003/0017697 | A1 | 1/2003 | Choi et al. |
| 2003/0049931 | A1 | 3/2003 | Byun et al. |
| 2003/0082296 | A1 | 5/2003 | Elers et al. |
| 2003/0116087 | A1 | 6/2003 | Nguyen et al. |
| 2003/0168750 | A1 | 9/2003 | Basceri et al. |
| 2003/0176065 | A1 * | 9/2003 | Vaartstra ..................... 438/688 |
| 2003/0200917 | A1 * | 10/2003 | Vaartstra ..................... 117/105 |
| 2003/0205729 | A1 | 11/2003 | Basceri et al. |
| 2004/0040494 | A1 * | 3/2004 | Vaartstra et al. ............. 117/104 |
| 2004/0152254 | A1 * | 8/2004 | Vaartstra et al. ............. 438/240 |
| 2005/0020060 | A1 | 1/2005 | Aaltonen et al. |
| 2006/0042752 | A1 * | 3/2006 | Rueger ..................... 156/345.1 |
| 2006/0046477 | A1 * | 3/2006 | Rueger ....................... 438/676 |
| 2006/0216419 | A1 | 9/2006 | Shero et al. |
| 2006/0231017 | A1 * | 10/2006 | Vaartstra ..................... 117/105 |
| 2006/0260750 | A1 * | 11/2006 | Rueger .................. 156/345.38 |

OTHER PUBLICATIONS

Becker, Highly Conformal Thin Films of Tungsten Nitride Prepared by Atomic Layer Deposition from a Novel Precursor, Chem. Mater., Jun. 2003, 2969-2976, vol. 15.

Kuo, T. et al., "Microwave-Assisted Chemical Vapor Deposition Process for Synthesizing Carbon Nanotubes", J. Vac. Sci. Technol. B 19(3), May/Jun. 2001, pp. 1030-1033.

Baghurst, D. et al., "Microwave Syntheses for Superconducting Ceramics", Nature, vol. 332 (Mar. 24, 1988), p. 311.

Juppo et al., "Use of 1,1-Dimethylhydrazine in the Atomic Layer Deposition of Transition Metal Nitride Thin Films"; Journal of the Electrochemical society; 147(9) 2000; pp. 3377-3381.

Juppo, "Atomic layer Deposition of Metal and Transition Metal Nitride Thin Films and In Situ Mass Spectrometry Studies"; University of Helsinki; Dec. 2001; 65 pp.

Elam et al., "Surface Chemistry and Film Growth During TiN Atomic Layer Deposition Using TDMAT and NH3"; www.sciencedirect.com; Mar. 12, 2003; 12 pp.

Klaus et al., "Atomic Layer Deposition of Tungsten Nitride Films Using Sequential Surface Reactions"; Journal of the Electrochemical society; 147(3) 2000; pp. 1175-1181.

Kim, H., "Atomic Layer Deposition of Metal and Nitride Thin Films: Current Research Efforts and Applications for Semiconductor Device Processing"; J. Vac. Sci. Technol. B 21(6); Nov./Dec. 2003; pp. 2231-2261.

\* cited by examiner

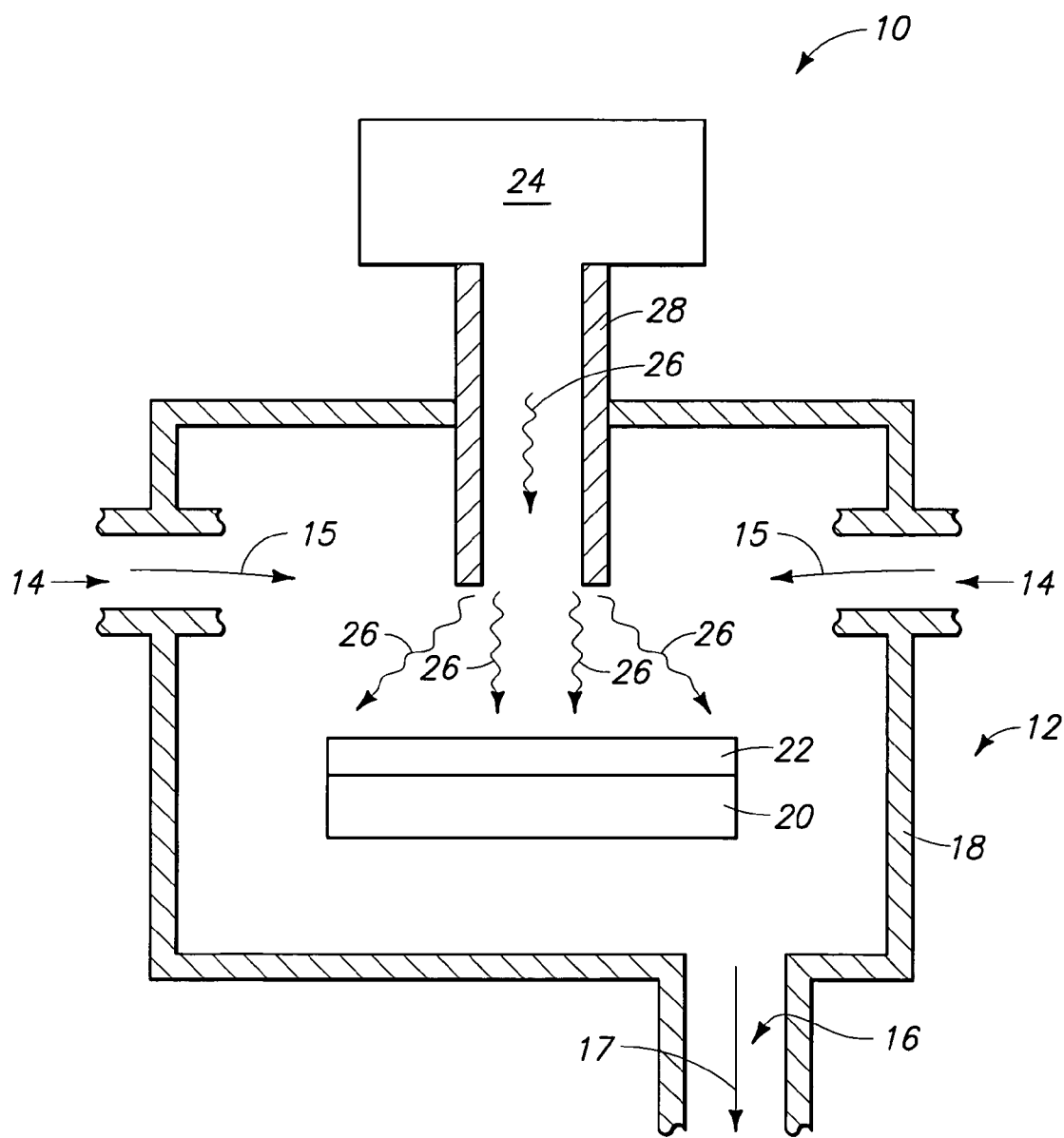
FIG. II

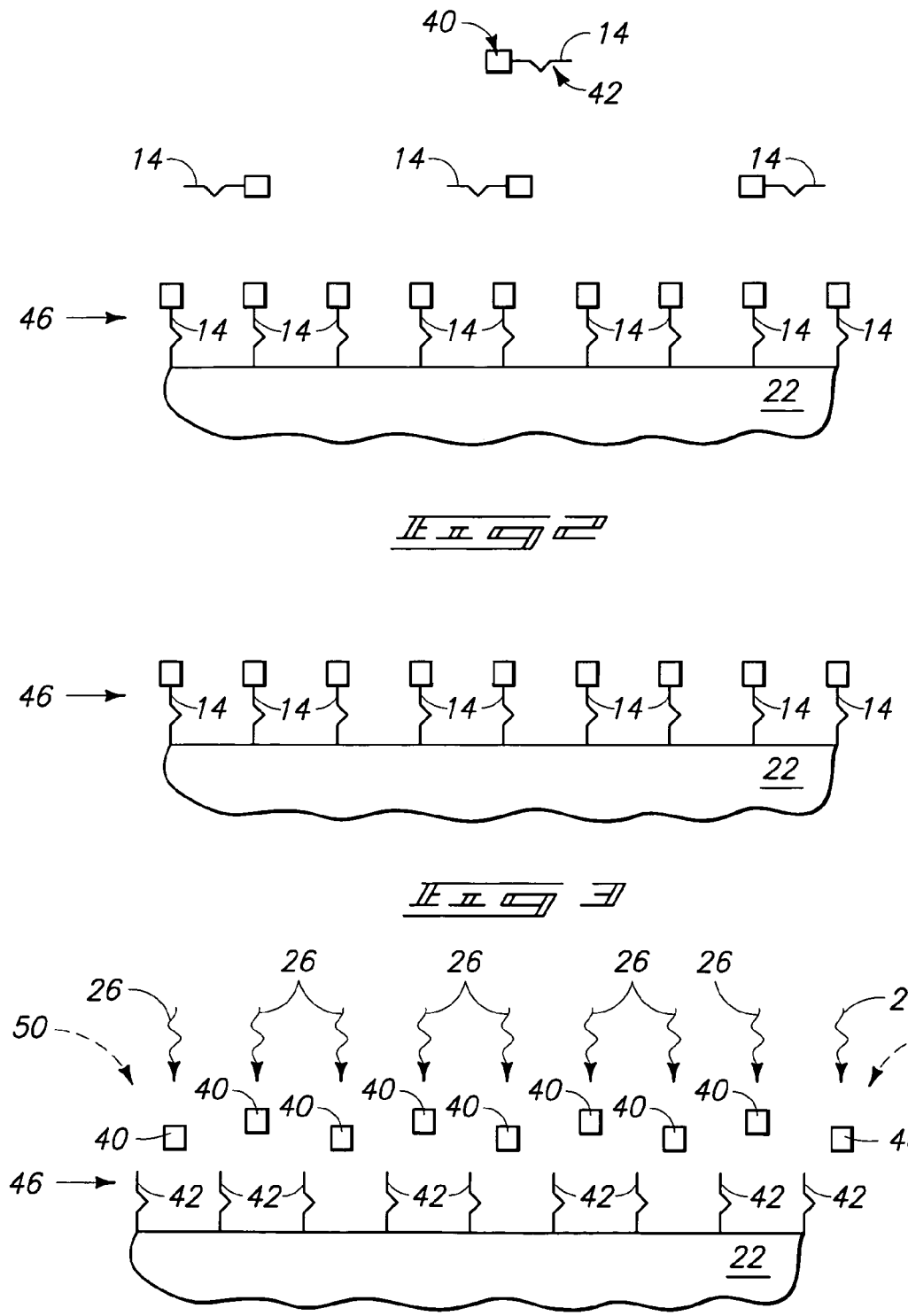

US 7,488,386 B2

ATOMIC LAYER DEPOSITION METHODS AND CHEMICAL VAPOR DEPOSITION METHODS

RELATED PATENT DATA

This patent application is a continuation of U.S. patent application Ser. No. 10/133,947, filed Apr. 25, 2002 which is now U.S. Pat. No. 7,374,617 issued May 20, 2008.

TECHNICAL FIELD

The invention pertains to deposition methods utilizing microwave excitation, and in particular applications pertains to chemical vapor deposition (CVD) methods and atomic layer deposition (ALD) methods.

BACKGROUND OF THE INVENTION

Semiconductor processing in the fabrication of integrated circuitry involves the deposition of layers on semiconductor substrates. Exemplary processes include chemical vapor deposition (CVD) and atomic layer deposition (CVD). CVD and ALD can be conducted within chambers or reactors which retain a single substrate upon a wafer holder or susceptor. One or more precursor gasses are typically provided to a shower head within the chamber which is intended to uniformly provide the reactant gasses substantially homogeneously over the outer surface of the wafer. The precursors react or otherwise manifest in a deposition of a suitable layer atop the substrate. Plasma enhancement may or may not be utilized. If plasma enhancement is utilized, the plasma can be generated and maintained either directly within the chamber or remotely therefrom.

Certain deposition processes are difficult to accomplish with ALD and/or CVD due to thermal instability of various precursors. It would be desirable to develop methods which enable ALD and/or CVD to be practiced with thermally unstable precursors.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY OF THE INVENTION

In one aspect, the invention includes an atomic layer deposition method. At least a fragment of a precursor material is chemisorbed on a substrate within a reaction chamber while not exposing the precursor material to microwave radiation. The chemisorbed material is then exposed to microwave radiation within the reaction chamber.

In one aspect, the invention encompasses a deposition method wherein a substrate is placed within a reaction chamber and a precursor is flowed into the chamber and utilized to deposit a layer on the substrate. After the layer is deposited, substantially all of the precursor not associated with the layer is removed from the chamber. Subsequently, the layer is exposed to microwave radiation within the chamber.

In one aspect, the invention encompasses a pulsed chemical vapor deposition method. A source of microwave radiation is provided proximate a reaction chamber. At least one precursor is flowed into the chamber to form a first layer that is more than one monolayer thick on a substrate. The precursor is not exposed to microwave radiation during formation of the first layer. After the first layer is formed, substantially all of the precursor is removed from the chamber, and subsequently the first layer is exposed to microwave radiation within the chamber. After the first layer is exposed to microwave radiation, the precursor is flowed into the chamber to form a second layer over the first layer.

BRIEF DESCRIPTION OF THE DRAWINGS

Preferred embodiments of the invention are described below with reference to the following accompanying drawings.

FIG. 1 is schematic, cross-sectional view of an exemplary apparatus which can be utilized in various aspects of the present invention.

FIG. 2 is a diagrammatic, cross-sectional view of a substrate at a preliminary processing stage of an exemplary aspect of the present invention.

FIG. 3 is a view of the FIG. 2 substrate shown at a processing stage subsequent to that of FIG. 2.

FIG. 4 is a view of the FIG. 2 substrate shown at a processing step subsequent to that of FIG. 3.

DETAILED DESCRIPTION OF THE PREFERRED EMBODIMENTS

Figure 5:
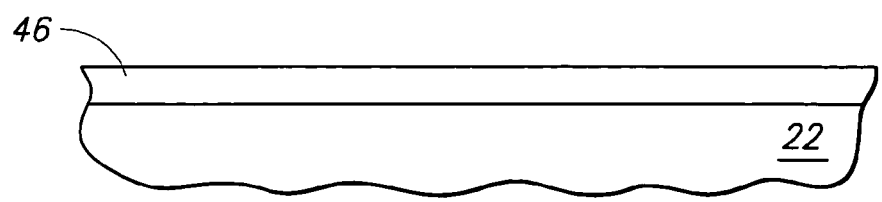
FIG. 5 is a view of the FIG. 2 substrate shown at a processing step subsequent to that of FIG. 4, and shown with a different diagrammatic illustration than that utilized in FIG. 4.

In particular aspects, the present application pertains to atomic layer deposition (ALD) technology. ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

The deposition methods herein are described in the context of formation of materials on one or more semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements along with the portions of Groups IIIA to VIA designated as metals in the periodic table, namely, Al, Ga, In, Tl, Ge, Sn, Pb, Sb, Bi, and Po. The Lanthanides and Actinides are included as part of Group IIIB. "Non-metals" refers to the remaining elements of the periodic table.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer is preferably formed. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of typical CVD processes is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species.

In particular aspects, the invention includes a recognition that thermally unstable precursors can be incorporated into ALD and/or CVD processes if thermal energy is provided at only specific times of the processes. For instance, ALD can be utilized with thermally unstable precursors if thermal energy is provided only after the precursors have chemisorbed to a substrate. Accordingly, the thermally unstable precursors can be introduced into a reaction chamber and maintained in an environment with relatively low thermal energy while the precursors are chemisorbed to a substrate. Subsequently, the precursors not chemisorbed to the substrate (i.e., the precursors not associated with a chemisorbed layer on the substrate) can be purged from the reaction chamber. After the precursors have been purged from the reaction chamber, the chemisorbed layer can be subjected to thermal energy to cause desired thermal breakdown or other thermally-induced reactions to occur within the chemisorbed monolayer. The thermal energy can be provided within the reaction chamber by, for example, emitting microwave radiation into the chamber. Specifically, the microwave radiation can be absorbed by various materials present in the reaction chamber to cause an increase in thermal energy within the chamber.

An exemplary apparatus which can be utilized in various aspects of the present invention is illustrated diagrammatically as an apparatus 10 in FIG. 1. Apparatus 10 comprises a reaction chamber 12 comprising inlet ports 14, and an exhaust port 16. In operation, precursors can be flowed into reaction chamber 12 through the inlet ports (with the precursors illustrated diagrammatically by the arrows 15 in FIG. 1), and exhausted from the reaction chamber through outlet port 16 (with an exhaust illustrated by arrow 17 of FIG. 1). Although two inlet ports and one outlet port are illustrated, it is to be understood that varying numbers of inlet ports and outlet ports can be utilized.

Inlet ports 14 can be in fluid communication with sources (not shown) of various precursors. Also, various purge gasses can be flowed through one or more of the inlet ports during operation of apparatus 10, with typical purge gasses being materials which are inert relative to reaction with materials or precursors present within reaction chamber 12.

Outlet 16 can have a valve (not shown) associated therewith to allow the outlet to be opened or closed at various times during operation of apparatus 10, and further a pump can be provided to assist in withdrawing materials from within reaction chamber 12 during evacuation of materials from the reaction chamber.

Reaction chamber 12 comprises a sidewall 18 which surrounds the chamber, and which is preferably constructed of materials inert relative to reaction of precursors that are ultimately to be flowed into reaction chamber 12.

A substrate holder 20 is provided within reaction chamber 12, and such supports a substrate 22. Substrate holder 20 can be retained in a desired location within chamber 12 utilizing various support structures (not shown). Also, substrate holder 20 can be utilized to assist in maintaining a desired temperature of substrate 22. Accordingly, substrate holder 20 can be coupled with components (not shown) utilized for either heating or cooling of substrate 22.

A microwave source 24 is provided proximate to reaction chamber 12 and utilized to direct microwave radiation 26 into reaction chamber 12, and in the shown application toward a surface of substrate 22. Microwave radiation from source 24 can be directed into chamber 12 with, for example, a waveguide 28 extending between source 24 and an interior of chamber 12.

The microwave radiation exiting waveguide 28 can be spread with an appropriate apparatus to form the shown spread orientation of microwaves 26 entering chamber 12. In addition, or alternatively, substrate 22 can be rotated within chamber 12 to enhance uniformity of exposure of an upper surface of substrate 22 to microwave radiation 26.

In operation, one or more precursors are flowed through inlets 14 and into chamber 12 to establish a desired pressure of the one or more precursors within the reaction chamber. A valve (not shown) can be associated with outlet 16 and adjusted to aid in establishing the desired pressure. Also, valves (not shown) can be associated with inlets 14 and utilized to aid in creating a pulsed flow of the precursor into the chamber. Once a desired pressure within the chamber is achieved, the pressure is maintained for a suitable time to form a layer over an upper surface of substrate 12. In an ALD process, the layer will typically be a monolayer chemisorbed to an upper surface of substrate 22, and in a CVD process the layer will typically be a layer more than one monolayer thick formed over substrate 22.

After the desired layer has been formed, precursor gasses are evacuated from chamber 12. During such evacuation, purge gasses can be flowed into the reaction chamber to assist in removing substantially all of the precursor gasses from within the chamber. The term "substantially all" is utilized to indicate that an amount of precursor within reaction chamber 12 is reduced to a level where gas phase reactions with subsequent reactant gases do not degrade the material properties of the deposited layer on the substrate.

Microwave radiation is not directed into the reaction chamber while the precursor material is being admitted to the reaction chamber. However, after substantially all of the precursor material has been removed from the reaction chamber, microwave radiation is directed toward substrate 22. The microwave radiation can activate materials of a layer (not shown) formed over substrate 22 to activate various desired reactions within such layer. The desired reactions can include, for example, thermally-induced reactions. The microwave radiation can be pulsed toward substrate 22 for a time of, for example, from about 0.1 second to about 60 seconds, and in particular applications for a time of from about 0.1 second to about 10 seconds.

The microwave radiation is subsequently turned off, or otherwise deviated from chamber 12, and precursors can be reintroduced into reaction chamber 12 to form a second layer on top of the first layer that had been produced by the initial introduction of precursor into reaction chamber 12. If the process is an ALD process, the second layer can be a monolayer. If the process is a pulsed CVD process, the second layer can be more than one monolayer thick.

Various aspects of the invention are described in further detail with reference to FIGS. 2-6. In referring to FIGS. 2-6, similar numbering will be utilized as was used above in describing FIG. 1, where appropriate.

Referring initially to FIG. 2, substrate 22 is illustrated at a preliminary processing stage. Substrate 22 would be within the reaction chamber 12 described with reference to FIG. 1, and precursor 14 is illustrated as being within the reaction chamber proximate substrate 22. The precursor 14 is illustrated schematically as comprising a head portion 40 and a tail portion 42 (labeled with respect to one of the shown precursor molecules). Head portion 40 can be considered as a portion of precursor molecule which is ultimately to be cleaved from the molecule after chemisorption of the precursor molecule to a desired surface, and tail portion 14 can be considered as being a portion of the precursor molecule which contains a part of the precursor that is ultimately to remain with substrate 22 as part of a layer formed over the substrate.

The precursor molecules 14 are shown forming a layer 46 over substrate 22, and in the shown application such layer is a monolayer. Each of the molecules 14 incorporated into monolayer 46 comprises at least a fragment of the precursor molecule that had been initially introduced into the reaction chamber. If the molecules incorporated into layer 46 have reacted with components of substrate 22 during chemisorption of the molecules onto substrate 22, then various portions of the molecules can be displaced during the chemisorption, and accordingly only fragments of the molecules are incorporated into layer 46. In other aspects, the molecules can interact with a surface of substrate 22 by a mechanism which does not involve displacement of any portions of the molecules, and accordingly entire molecules can be incorporated into layer 46.

Although the layer 46 is shown as a monolayer, it is to be understood that the layer 46 can be more than one monolayer thick. If a process is an atomic layer deposition process, then layer 46 will typically be one monolayer thick. In contrast, if the process is a chemical vapor deposition process, the layer 46 will typically be more than one monolayer thick.

Although the precursor molecules 14 are shown depositing onto a surface 22 without reaction of the precursor molecules with one another, it is to be understood that other aspects of the invention can comprise flowing multiple precursor molecules into a reaction chamber and forming layer 46 of reaction products generated by reaction of the various precursor molecules with one another.

During the formation of layer 46 at the processing stage of FIG. 2, microwave radiation (26 of FIG. 1) is not directed into the reaction chamber. Substrate 22 can, however, be heated to a desired temperature utilizing thermal energy transferred from holder 20 (FIG. 1) during formation of layer 46. Additionally and/or alternatively, heat can be imparted to substrate 22 from a lamp (not shown) proximate substrate 22. In yet other applications, substrate 22 can be cooled during formation of layer 46 utilizing, for example, a cooling mechanism (not shown) associated with holder 20 (FIG. 1).

Numerous materials can be utilized as precursor 14, depending on the layer 46 which is ultimately to be formed. For instance, precursor 14 can comprise an ultimate component of a deposited layer joined with a group comprising nitrogen and carbon, with the ultimate component being part of the tail 42, and the group comprising nitrogen and carbon being part of head 40. In particular aspects, the ultimate component can be a metal, and such metal can be coordinated with the group comprising nitrogen and carbon. An exemplary precursor material is tetrakis-dimethylaminotitanium (TDMAT). The ultimate component within such precursor is titanium. In various aspects of the invention, an ultimate component can comprise, for example, one or more of Sr, Ba, Ti, Zr, Hf, Nb, Ta, Y, La, Pr, Gd, Er, Al, Si and Ge.

As another example, precursor 14 can comprise an ultimate component joined with a group comprising oxygen and carbon. The group comprising oxygen and carbon can be, for example, an alkoxide. In such applications, the ultimate component can be incorporated within tail 14, and the alkoxide can be comprised by head 40. The ultimate component can comprise metals and/or non-metals, and in particular aspects can comprise, for example, on or more of Ti, Zr, Hf, Nb, Ta, Al, Ga, Si, P and Ge. For instance, the precursor material can comprise titanium isopropoxide.

If the ultimate component of a precursor is a metal, the precursor can comprise metal coordinated to oxygen and carbon, or to nitrogen and carbon. Such are exemplary materials included within a class referred to as metallo-organics.

Referring to FIG. 3, substrate 22 is illustrated after precursor molecules not associated with layer 46 have been evacuated from the reaction chamber (12 of FIG. 1).

Referring to FIG. 4, microwave radiation 26 is shown being directed toward layer 46 to cause a reaction within layer 46. The shown reaction involves cleavage of head portions 40 from tail portions 42. In exemplary applications in which precursors 14 (FIG. 3) comprise metal alkoxides, the cleavage can comprise release of organic materials from the metal alkoxides to leave metal oxides remaining within layer 46 as the shown portions 42. In applications in which the precursor materials comprise other organo-metallic materials, the shown cleavage can generically refer to removal of at least a portion of the organic components to leave the metal-containing components as portions 42 extending across a surface of substrate 22. In some aspects an entirety of the organic components can be removed, and in other aspects only portions of the organic components are removed. In aspects in which only portions of the organic components are removed, remaining portions of the organic components can be utilized during subsequent chemisorbtion of additional precursor. The subsequent chemisorbtion may involve reaction of the remaining organic components with the additional precursor, and can, in particular aspects, involve cleavage or evolution of at least portions of the remaining organic components.

In a particular exemplary application in which the precursors comprise metal coordinated with a group comprising nitrogen and carbon, the shown cleavage can comprise removal of the organic material to leave a metal nitride remaining over substrate 22 as portion 42. Exemplary metal nitrides include titanium nitride and zirconium nitride. In applications in which the portion of 42 is a metal oxide, exemplary metal oxides include titanium oxide and zirconium oxide.

An optional reactant 50 is shown being directed toward a surface of substrate together with microwave radiation 16. Dashed arrows are used to emphasize that the reactant 50 is an optional material. Reactant 50 can be utilized to enhance cleavage of portion 40 from portion 42 during the processing of FIG. 4, and/or can be used to generate a desired product from portion 42 within layer 46.

In an exemplary application, precursor 14 (FIG. 3) will comprise a metal coordinated with a group comprising nitrogen and carbon, and the reactant 50 will comprise nitrogen. The nitrogen-containing reactant 50 can be utilized to enhance formation of a desired metal nitride from the portion 42. Exemplary nitrogen-containing reactants include, for example, $NH_3$, organic amines, $N_2$, and hydrazine. The utilization of a nitrogen-containing reactant in combination with microwave radiation 26 can reduce an amount of organic material remaining within layer 46 relative to that which may remain in the absence of the reactant 50.

In other applications, a metal oxide can be desired within layer 46, and reactant 50 can comprise an oxygen-containing reactant, such as, for example, $O_2$, $O_3$, etc. In such applications, the precursor 14 (FIG. 3) can comprise a metallo-organic, and the reactant 50 can be utilized for enhancing the removal of the organic portion as well as to convert the metallic portion to a metal oxide.

Although the reactant 50 is illustrated in FIG. 4 as being flowed into a reaction chamber (12 of FIG. 1) during exposure of layer 46 to microwave radiation 26, it is to be understood that reactant 50 can be additionally and/or alternatively provided into the reaction chamber before or after layer 46 is exposed to the microwave radiation. For instance, reactant 50 can be provided at the processing stage of FIG. 3, and subsequently purged from the chamber during exposure of layer 46 to the microwave radiation at the processing stage of FIG. 4. In such applications, the reactant can be utilized to convert the molecules within layer 46 to an initial composition, and subsequently microwave radiation can be directed toward such initial composition to convert the initial composition to a desired composition.

Microwave radiation 26 can induce reactions within layer 46 through various mechanisms, including, for example, by inducing various thermal reactions within layer 46. In particular applications, microwave source 26 can be utilized to activate materials associated with layer 46 which are known to readily absorb microwave radiation, and to thereby induce thermal heating of the materials. Materials known to absorb microwave radiation include, for example, various metal oxides, such as zirconium oxide.

In particular applications, thermal energy can be provided from one or more sources in addition to the microwave radiation, with such additional sources including, for example, lamps and/or heat sources associated with holder 20 (FIG. 1.).

Referring to FIG. 5, such shows substrate 22 and layer 46 at a processing step subsequent to that of FIG. 4. Specifically, FIG. 5 shows that the cleaved materials 40 (FIG. 4) have been removed from reaction chamber 12 (FIG. 1), and that microwave radiation 26 (FIG. 4) is no longer being directed at layer 46. Additionally, layer 46 is illustrated differently than in FIG. 4, and specifically the layer 46 is shown schematically as a single uniform layer formed physically against an upper surface of substrate 22.

Figure 6:
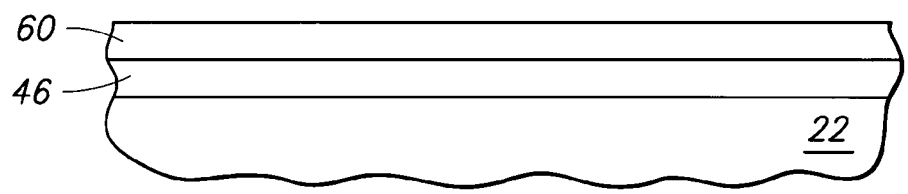
FIG. 6 is a view of the substrate of FIG. 2 shown at a processing stage subsequent to that of FIG. 5, and shown utilizing the same type of diagrammatic view as is utilized for FIG. 5.

Referring to FIG. 6, a second layer 60 is shown formed over and physically against layer 46. Layer 60 can be formed utilizing processing analogous to that described with reference to FIGS. 2-5, and accordingly can comprise the same composition as layer 46. For instance, if a pulsed CVD method is utilized to form layers 46 and 60, then the layers can be identical to one another, and can each comprise a thickness greater than a single monolayer. In other applications, layer 60 can be different from layer 46, but can be formed utilizing the methodology described with reference to FIGS. 2-5. For instance, layers 46 and 60 can each be formed by an atomic layer deposition process, with layer 60 being formed utilizing processing similar to that of FIGS. 2-5, but utilizing a different precursor than that utilized for forming layer 46. Further, both layers 60 and 46 can comprise monolayers.

In further processing, additional layers (the additional layers are not shown, but could be either monolayers or layers thicker than monolayers) can be stacked on top of layers 46 and 60. The additional layers can be formed utilizing the processing FIGS. 2-5, or utilizing traditional ALD or CVD processing. If traditional ALD or CVD processing is utilized, the microwave radiation can be applied continuously during chemisorption and/or reaction of precursors, or can be not applied at all.

Figure 7:
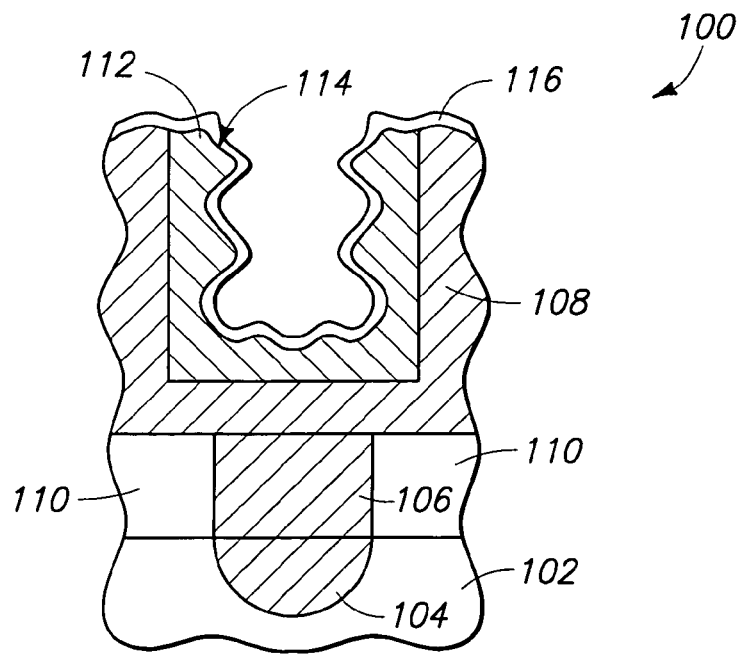
FIG. 7 is a diagrammatic, cross-sectional view of a semiconductor structure processed in accordance with an aspect of the present invention.

FIG. 7 illustrates an exemplary application of the present invention. Specifically, FIG. 7 illustrates a construction 100 comprising a substrate 102 having a conductively-doped diffusion region 104 therein. Substrate 102 can comprise, for example, monocrystalline silicon. A pedestal 106 extends upwardly from the conductively-doped diffusion region, and is in electrical contact with a container-shaped storage node 108. An insulative material 110 is provided around pedestal 106. Insulative material 110 can comprise, for example, borophosphosilicate glass, and conductive materials 106 and 108 can comprise, for example, conductively-doped silicon and/or various metals.

A conductive material 112 is within a container defined by material 108, and material 112 comprises a convoluted surface 114. Material 112 can correspond to, for example, conductively-doped hemispherical grain silicon.

Traditionally, it has been difficult to form metal nitride across a roughened surface 114 of hemispherical grain silicon. However, methodology of the present invention can be utilized to form a metal nitride layer 116 across surface 114. Specifically, highly reactive precursors (such as, for example, TDMAT) can be flowed into a reaction chamber, and a thermal energy can be kept low during chemisorption of such precursors across the surface 114. Subsequently, substantially all precursors not associated with a layer chemisorbed over surface 114 can be evacuated from the chamber. After the precursors have been evacuated from the chamber, the layer chemisorbed over surface 114 can be exposed to microwave radiation to form a desired metal nitride layer 116. The formation of the desired layer can be enhanced by introduction of one or more nitrogen-containing reactants during the exposure of the chemisorbed material to microwave radiation, with exemplary nitrogen-containing reactants including $NH_3$, $N_2$, and hydrazine.

The metal nitride layer 116 can correspond to, for example, titanium nitride, and in the shown application is formed physically against the convoluted surface 114 of material 112. In subsequent processing (not shown) a dielectric material can be provided over material 116, and a second conductor material can be provided over the dielectric material and capacitively separated from conductor material 112 by the dielectric material. Accordingly, materials 116 and 112 can be incorporated into a capacitor device. Such device can be electrically connected with a transistor structure (not shown) to form a dynamic random access memory (DRAM) device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method comprising:
   flowing a first non microwave-activated precursor into a reaction chamber and depositing at least a fragment of the first non microwave-activated precursor onto a substrate to form a first layer; and
   exposing the first layer to microwave radiation for a period of time of from about 0.1 second to about 60 seconds; and
   after the exposing, flowing a second non microwave-activated precursor into the reaction chamber and depositing at least a fragment of the second non microwave-activated precursor onto the first layer to form a second layer.

2. The method of claim 1 wherein the exposing to the microwave radiation lasts for a period of time of from about 0.1 second to about 10 seconds.

3. The method of claim 1 further comprising after depositing at least a fragment of the first non thermally-activated precursor, providing a reactant within the reaction chamber and reacting the reactant with the first layer.

4. The method of claim 3 wherein the reacting is performed in The presence of the microwave radiation within the chamber.

5. The method of claim 3 wherein the reactant is activated prior to providing the reactant into the reaction chamber.

6. The method of claim 3 wherein the reactant is selected from the group consisting of $NH_3$, organic amines, $N_2$, and hydrazine.

7. The method of claim 1 wherein:
   the first precursor comprises a component ultimately to be within a layer on a substrate;
   the component is joined with a group comprising nitrogen and carbon; and
   the microwave radiation releases the group comprising nitrogen and carbon from the component.

8. The method of claim 7 wherein the component comprises one or more of Sr, Ba, Ti, Zr, Hf, Nb, Ta, Y, La, Pr, Ga, Gd, Er, Al, Si, P and Ge.

9. An atomic layer deposition method comprising:
   sequential deposition of a first precursor material and a second precursor material to form a layer, each of the first and second precursor materials being thermally unstable and each of the first and second precursor materials being introduced into a reaction chamber and deposited on a substrate at low thermal energy; and
   after depositing either the first precursor material or both the first and second precursor materials, thermally inducing reactions to occur in the layer by exposing to microwave radiation for a time period of from about 0.1 seconds to about 60 seconds.

10. The method of claim 9 further comprising after deposition the first precursor material, purging the reaction chamber prior to the thermally inducing.

11. An atomic layer deposition method comprising:
   providing a thermally unstable first precursor into a reactor and chemisorbing the first precursor onto a substrate without thermally breaking down or thermally reacting the first precursor;
   purging the reactor;
   after purging the reactor, exposing the chemisorbed precursor to an increased thermal energy comprising exposing to microwave radiation for a time period of from about 0.1 seconds to about 60 seconds;

after the exposing, decreasing the thermal energy; and providing a thermally unstable second precursor into the reactor and chemisorbing the second precursor over the substrate without thermally breaking down or thermally reacting the second precursor.

12. The method of claim 11 wherein the exposing comprises exposing to microwave radiation for a time period of about 0.1 to 10 seconds.

13. The method of claim 11 further comprising, prior to providing the second precursor, introducing a reactant into the reactor and reacting the reactant with the first precursor.

14. The method of claim 13 wherein the reacting is conducted in the presence of the increased thermal energy.

* * * * *

UNITED STATES PATENT AND TRADEMARK OFFICE
CERTIFICATE OF CORRECTION

| | | |
|---|---|---|
| PATENT NO. | : 7,488,386 B2 | Page 1 of 1 |
| APPLICATION NO. | : 11/452817 | |
| DATED | : February 10, 2009 | |
| INVENTOR(S) | : Vaartstra | |

It is certified that error appears in the above-identified patent and that said Letters Patent is hereby corrected as shown below:

In column 10, line 20, in Claim 3, delete "thermally" and insert -- microwave --, therefor.

In column 10, line 24, in Claim 4, delete "The" and insert -- the --, therefor.

In column 11, line 8, in Claim 12, delete "about" and insert -- from --, therefor.

Signed and Sealed this

Twenty-eighth Day of April, 2009

JOHN DOLL
*Acting Director of the United States Patent and Trademark Office*